United States Patent [19]

Zanazzo et al.

[11] 4,337,500
[45] Jun. 29, 1982

[54] PHYSICAL-VARIABLE MEASURING, ADJUSTING AND DISPLAYING INSTRUMENT

[76] Inventors: Pietro Zanazzo, Via Crespi, 55, 28100-Novara; Giuliano Mainardi, Corso Alpi, 14, Bellusco - Milano; Rodolfo Giorgetti, Via Milite Ignoto, 20, Seveso - Milano, all of Italy

[21] Appl. No.: 170,531

[22] Filed: Jul. 21, 1980

[30] Foreign Application Priority Data

Mar. 14, 1980 [IT] Italy .................. 20676 A/80

[51] Int. Cl.$^3$ .......................................... H05K 1/14
[52] U.S. Cl. ............................ 361/395; 361/399; 361/405
[58] Field of Search ............ 339/17 M, 17 N, 17 MN; 361/346, 380, 395, 399, 400, 405, 412, 415, 426, 429

[56] References Cited

U.S. PATENT DOCUMENTS

| | | | |
|---|---|---|---|
| 3,631,299 | 12/1971 | Meyer | 361/412 |
| 3,729,657 | 4/1973 | Callan | 361/399 |
| 3,775,643 | 11/1973 | Schachnow | 361/399 |
| 4,079,438 | 3/1978 | Schmall | 361/399 |
| 4,107,760 | 8/1978 | Zimmer | 361/412 |
| 4,203,148 | 5/1980 | McComas | 361/399 |
| 4,271,455 | 6/1981 | McComas | 361/426 |

*Primary Examiner*—Gerald P. Tolin
*Attorney, Agent, or Firm*—Bucknam and Archer

[57] ABSTRACT

The measuring, adjusting and displaying instrument is of the type comprising a front panel and a pair of printed circuit cards, effective to be inserted into a box, said front panel comprising supporting and guiding means effective to support and guide said cards, and through openings provided for receiving driving and displaying elements. The two printed circuit cards or boards have the driving and displaying elements fixed at 90° with respect to the card plane on the front end portion thereof, being bent parallely to said plane in such a position that, upon having inserted the cards into the supporting and guiding means of the front panel, said driving and displaying elements are effective to automatically insert into the provided openings, thereby being visible and accessible by the operator.

On the front panel there are provided means for slidingly applying a handle for withdrawing the instrument from its box, in such a way that the handle can be brought to a retracted position as it is not used.

The through openings provided for receiving the driving and displaying elements are so arranged and shaped as to permit said elements to be located both horizontally and vertically.

3 Claims, 11 Drawing Figures

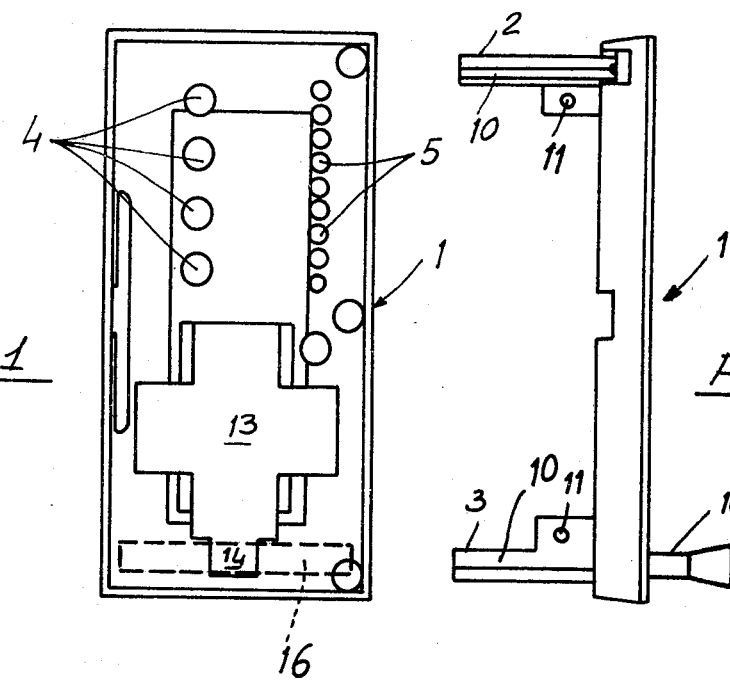
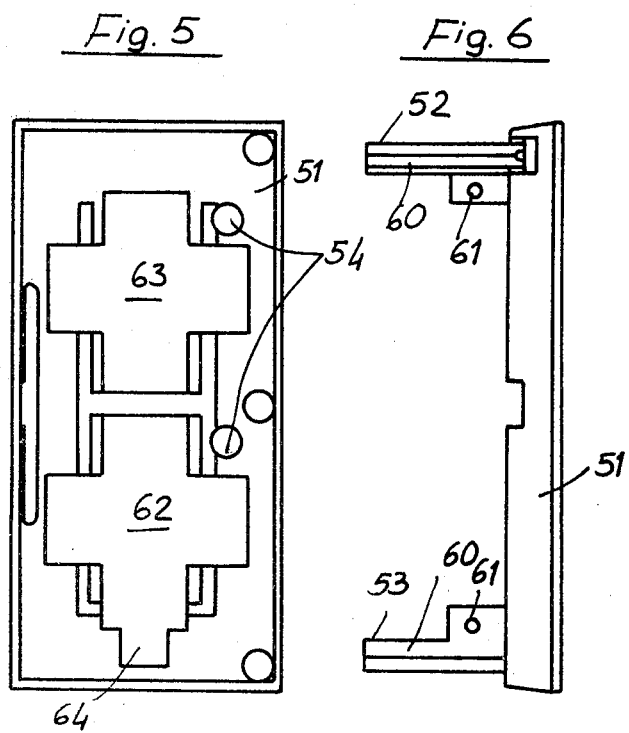

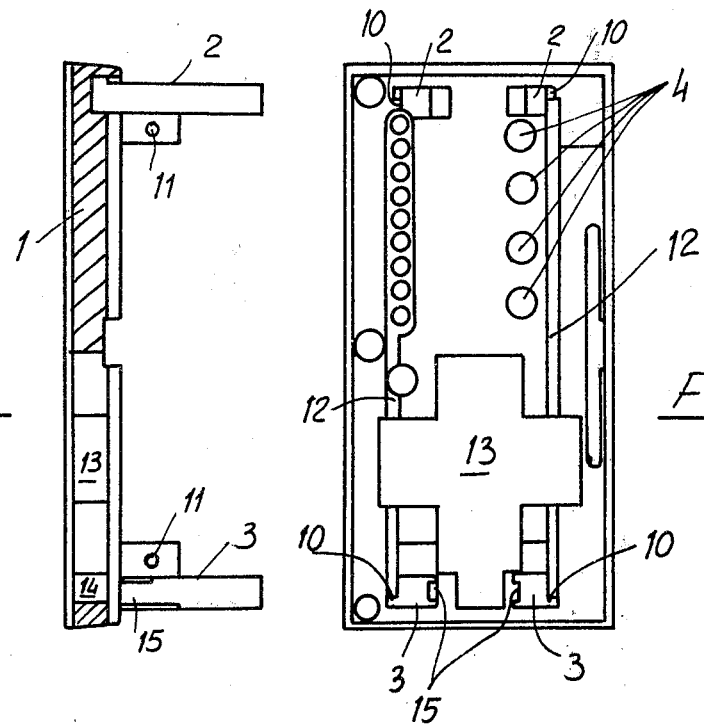
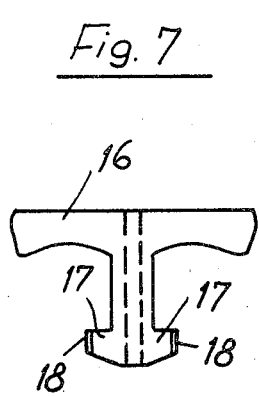
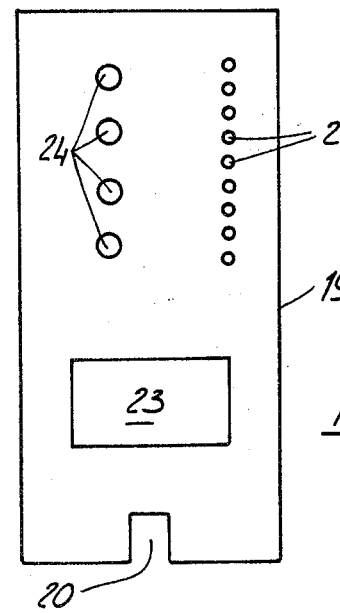

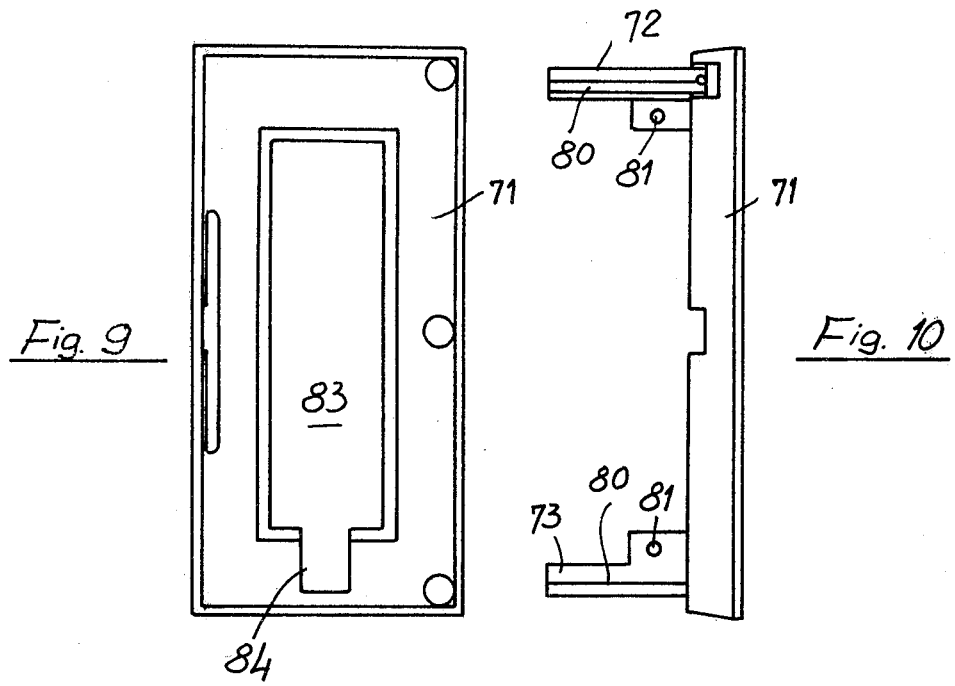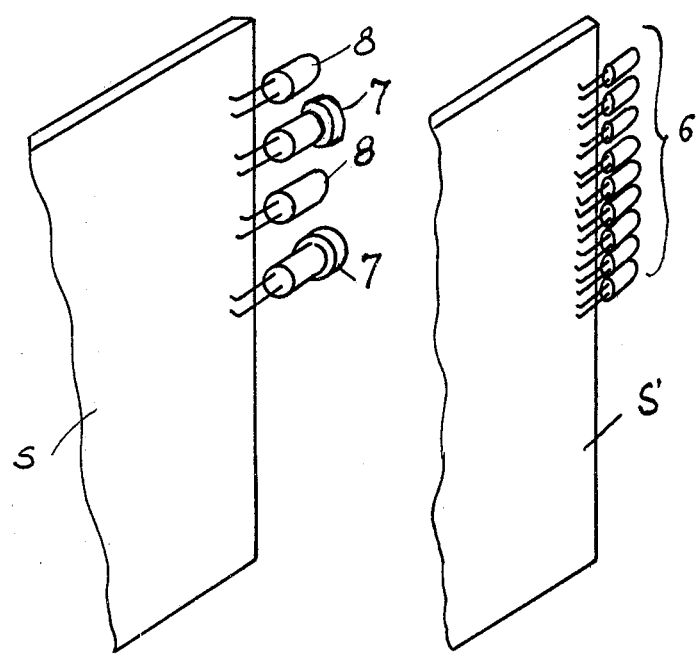

PHYSICAL-VARIABLE MEASURING, ADJUSTING AND DISPLAYING INSTRUMENT

DESCRIPTION

The present invention generally relates to measuring, adjusting and displaying instruments and, more specifically, to instruments of the aforesaid type effective to also provide a visual display of the adjusted or controlled variable or parameter and of the possible drifts thereof from a predetermined value.

The instruments of this type as used so far and those recently constructed comprise, generally, a front panel therewith two printed circuit cards or boards are associated, the overall assembly being effective to be slidingly inserted into a box. In order to obtain a visual display and a control on the front panel it is necessary to provide said front panel both with warning lights or marks and driving or controlling elements accessible by the operator. In order to provide the front panel with said elements, it is necessary to provide for a central supporting element between the two printed circuit boards effective to support the controlling elements, while allowing for said elements to be connected to the terminals or "pins" of the printed circuit board.

Furthermore, in order to be able of withdrawing from the box the front panel and the printed circuit boards coupled thereto, it is necessary to provide a handle or the like, projecting from the front panel by such a distance as to permit the operator to grip said handle by his fingers.

Obviously the preceding needs cause the instrument to have a rather complex structure, frequently failing of meeting the user requirements.

In addition, the presence of a handle projecting from the front panel has the drawbacks of a greater size of the instrument and possible failures of the handle in the case of collisions.

Another drawback of these known instruments is that it is necessary to provide said central supporting element for the displaying and controlling elements, with consequent material and time expenses as required for making the different electrical connections.

The task of the present invention is to obviate the drawbacks thereinabove cited by providing a measuring, adjusting and displaying instrument which is greatly simple and effective and able to met all the requirements of the users.

Within said task, it is a specific object of the invention to provide a measuring, adjusting and displaying instrument which is rationally designed in such a way as to greatly simplify the structure of said instrument.

Another object of the present invention is to provide a measuring, adjusting and displaying instruments so designed and constructed as to reduce to a minimum the steps required for assembling and electrically connecting said instrument.

Yet another object of the present invention is to provide a measuring, adjusting and displaying device which is of great operative reliability.

The thereinabove task and objects, as well as other objects which will become more apparent thereinafter, are achieved by a measuring, adjusting and displaying device, according to the invention, of the type comprising a front panel and a pair of printed circuit boards or cards, characterized in that said front panel is provided with supporting and guiding means effective to support and guide said boards, and through openings provided for receiving controlling and displaying elements, said printed circuit boards having the controlling and displaying elements fixed at 90° with respect to said said board plane on the front end portion thereof and bent parallely to said plane at such a position that, upon having inserted said boards into said supporting and guiding means of said front panel, said controlling and displaying elements are able of automatically insert into said provided openings thereby being visible and accessible by an operator.

According to an aspect of the present invention, on said front panel there are provided means for slidingly applying a handle for withdrawing the instrument from its box, said handle being effective to be brought to a retracted position, as it is not used, thereby obviating the drawback of a failure due to a possible collision, and of a great size for said front panel.

According to another aspect of the present invention, said through openings provided for receiving said controlling and displaying elements are so arranged and shaped as to allow for said elements to be located both horizontally and vertically.

The invention will be thereinafter described in a more detailed way with reference to several embodiments thereof, described by way of an exemplary and not limitative example, and illustrated in the accompanying drawings, where:

FIG. 1 is a front view of the front panel of a temperature adjusting or controlling instrument, the handle thereof being represented by dashes;

FIG. 2 is a side view of that same instrument;

FIG. 3 is a cross-section of the front panel illustrated in FIG. 1, as taken along the line III—III of FIG. 4;

FIG. 4 is a rear view of the front panel illustrated in FIG. 1;

FIG. 5 is a front view of the front panel of a temperature comparing instrument according to the present invention;

FIG. 6 is a side view thereof;

FIG. 7 is a plan view of the handle effective to withdraw or pull out the measuring instrument according to the invention;

FIG. 8 is a front view of a plate provided for frontwardly closing the front panel of FIG. 1;

FIG. 9 is a front view of the front panel of a digital voltmeter according to the invention;

FIG. 10 is a side view thereof;

FIG. 11 is a perspective partial view illustrating the printed circuit boards or cards provided for cooperating with the thereinabove described front panels, the controlling and displaying elements being fixed at 90° on the front edge zone thereof.

FIGS. 1, 2, 3 and 4 show the front panel of a temperature adjusting instrument or device, according to the present invention. As shown in these figures, the instrument comprises a frame, overally indicated at 1, of rectangular shape and having at the rear portion thereof a pair of upper arms 2 and a pair of lower arms 3 as projecting perpendicularly therefrom. Through its wall there are formed, as shown at the left portion of FIG. 1, four holes 4 provided for receiving controlling or driving and displaying elements, at the right portion being formed a plurality of small holes 5 provided for receiving a corresponding plurality of LED diodes. The controlling and displaying elements may consist, for example, of warning lights 8, effective to provide a warning indication or signal as the temperature is exceedingly passed, and of potentiometer 7 (FIG. 11). The LED diodes indicated at 6 in FIG. 11 provide a drift parameter indicative of the drifting or offsetting from an adjusted value, the potentiometer 7 (FIG. 11) being for the calibration adjusting. As it is shown in FIG. 11, both said LED diodes 6 and the other elements 7 and 8 are applied to the printed circuit boards S, S', at 90° with respect to the laying plane of said boards; the connection wires are bent through 90° in such a way that all the thereinabove cited elements lay in a plane which is substantially parallel to said boards plane. The arms 2 and 3 of the frame are provided on the outside thereof, at a side, with guiding slots 10 for slidingly receiving said printed circuit boards.

Two vertical slots or grooves 12 (FIG. 4) extend between the two upper arms 2 and the two lower arms 3 and act to receive therein the front edges of said boards S and S'. Upon having inserted said boards S and S' into said side slots 10 of said arms 2 and 3 and into the slots 12 between said arms 2 and 3, said boards are fixed in position by means of screws engaged in the holes 11 of said arms. Upon having fixed in position said boards, the LED diodes 6 will be precisely inserted into the holes 5 therefor, and the controlling and signalling elements 7 and 8 will be precisely inserted into the holes 4.

From the above description the great advantage provided by the invention is clearly evident, since it is possible to do away with the central supporting element bearing said elements 6, 7 and 8 and the related operations for electrically connecting said elements to the boards S and S'.

The frame 1 is furthermore provided with a cross-shaped opening 13, having four like arms, provided for receiving or housing a digital setter having a rectangular shape with the small side equal to the small side of the cross arms and the great side equal to the spacing between the ends of the two aligned arms of the cross. Owing to the shape of said opening, said setter (not shown) may be located either horizontally or vertically thereby providing the possibility of locating the temperature adjusting instrument either vertically or horizontally. The lower arm of the opening 13 is provided with a rectangular notch 14, aligend between the lower arms 3, each said lower arm being provided, on the inside side thereof, with a shallow slot 15, said slots acting as sliding guides for a handle 16.

The handle 16 is approximately of T-shape, the vertical stem of the T being provided with two fins 17, projecting from opposite sides, and having, at the ends thereof, two recessed portions 18 effective to be inserted in said shallow slots 15 formed in the arms 3. Thus the handle 16 is able of sliding in said slots thereby, if it is necessary, the handle can be withdrawn and easily gripped by the fingers of a hand in order to pull out from the box the frame-printed circuit board assembly. Upon having inserted into the box the frame-printed circuit assembly, the handle 16 may be displaced inwardly, screwing in said handle in order to not project from the instrument as this latter is used.

The instrument also comprises a front plate 19 (FIG. 8) having holes 24 corresponding to the holes 4 of said frame, holes 25 corresponding to the holes 5 of the frame, and a rectangular opening 23 provided for receiving said setter and corresponding to the opening defined by two aligned arms of the cross-shaped opening 13. At the bottom the plate 19 is provided with a rectangular notch 20 effective to enclose the stem of the handle 16, thereby, as the plate 19 is fixed at the front to the frame 1 and the handle is inserted into the notch 14, the handle being prevented from disengaging from the thus formed housing.

FIGS. 5 and 6 show the frame 51 effective to be used in a temperature comparing instrument. The frame 51 is of the type of the frame 1 in FIG. 1 and is provided with two upper arms 52 and two lower arms 53, two holes 54 each provided for receiving a respective signalling element, guides 60 for slidingly receiving the printed circuit cardboards S and S', and holes 61 for fixing in position said boards. In this case there are provided two cross-shaped openings 62 and 63, equal to the opening 13 of the frame 1, provided for receiving both horizontally and vertically controlling devices, and the notch 64 for receiving the handle 16. For the remaining elements, the frame 51 is equal to the frame 1.

FIGS. 9 and 10 show a frame 71 effective to be used in a digital voltmeter. This frame 51 is also of the type illustrated in FIGS. 1 and 5 and is provided with two upper arms 72 and two lower arms 73 the guides 80 for slidingly inserting the boards S and S' and the holes 81 for fixing into position said boards. In this case there are provided a rectangular central opening 83 and the notch 84 for receiving the handle 16. With respect to the remaining elements, the frame 71 is like the frames 1 and 51.

From the above description the great flexibility afforded by the front panel according to the invention is self evident, since said front panel may be used in a number of different applications and, by varying the holes provided on the front plate, the frame may be used in multiple different ways thereby providing the possibility of making a great number of instruments.

In addition it has the great advantage of providing a retractable type of handle, in all the embodiments thereof.

It should be particularly pointed out the rationality of the structure of the thus obtained instrument, which permits to obviate all of the drawbacks of the known instrument of this type. Finally the maintenance of the instrument is greatly facilitated thereby helping forward the user.

In practicing the invention, the used materials, provided that they are compatible with the provided use, and the size and specific shapes will be any depending on the needs.

We claim:

1. A measuring, adjusting and displaying device, comprising a front panel and a parallel spaced printed circuit board pair, effective to be inserted into a box, characterized in that said frontal panel comprises supporting and guiding means supporting and guiding said printed circuit boards, and, through openings in said front panel effective to receive controlling and displaying circuits, said two printed circuit boards being perpendicular to said front panel and being provided with controlling and displaying elements fixed to said boards on the front end portions thereof, said elements extending parallel to said boards and fixed to said boards by leads having a 90° bend therein, said controlling and displaying elements extending into said through openings, the elements thereby being visible and accessible by an operator from the front of the device, said printed circuit board supporting and guiding means consisting of slots formed on two pairs of arms rigid with said front panel and projecting substantially perpendicularly therefrom at the rear portion thereof, a pair of arms being located at the top and a pair at the bottom, said slots receiving therebetween the upper and lower edges of said boards.

2. The device according to claim 1 characterized in that said front panel being further provided with at least a cross-shaped opening having four arms and effective to receive a controlling element between two aligned arms of said cross.

3. The device according to claim 2 characterized in that a notch is provided on a pull-out handle, and slots are formed on the inside of said lower arm pair, slidingly receiving side fins or tongs on the stem of said handle.

* * * * *